United States Patent
Streibl et al.

(10) Patent No.: US 7,087,938 B2
(45) Date of Patent: Aug. 8, 2006

(54) ESD PROTECTIVE CIRCUIT WITH COLLECTOR-CURRENT-CONTROLLED TRIGGERING FOR A MONOLITHICALLY INTEGRATED CIRCUIT

(75) Inventors: Martin Streibl, Petershausen (DE); Kai Esmark, Neuried (DE); Christian Russ, Diedorf (DE); Martin Wendel, Hohenbrunn (DE); Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/070,824

(22) Filed: Mar. 1, 2005

(65) Prior Publication Data

US 2005/0195540 A1 Sep. 8, 2005

(30) Foreign Application Priority Data

Mar. 1, 2004 (DE) ...................... 10 2004 009 981

(51) Int. Cl.
*H01L 29/72* (2006.01)
*H02H 3/00* (2006.01)

(52) U.S. Cl. ......................... 257/173; 361/56
(58) Field of Classification Search .................. 361/56; 257/173
See application file for complete search history.

(56) References Cited

U.S. PATENT DOCUMENTS 5,148,250 A * 9/1992 Winnerl et al. ............. 257/361
5,521,783 A * 5/1996 Wolfe et al. ................... 361/56
5,576,557 A 11/1996 Ker et al.
6,768,616 B1* 7/2004 Mergens et al. ............... 361/56
2002/0154463 A1* 10/2002 Mergens et al. ............... 361/56
2005/0057866 A1* 3/2005 Mergens et al. ............... 361/56

FOREIGN PATENT DOCUMENTS

DE 195 18 549 C2 11/1999
EP 0 477 392 A1 9/1990
EP 1 294 025 A2 3/2003

OTHER PUBLICATIONS

Marcus P.J. Mergens, Christian C. Russ, Koen G. Verhaege, John Armer, Philip C. Jozwiak and Russ Mohn, *High Holding Current SCRs (HHI-SCR) for ESD Protection and Latch-Up Immune IC Operation*, EOS/ESD-Symposium 2002, Lecture 1A3.

M. Reisch, "*Elektronische Bauelemente*", pp. 949-953, Electronics Components, Spriner Verlag, Section 10, 1998.

* cited by examiner

*Primary Examiner*—Evan Pert
(74) *Attorney, Agent, or Firm*—Brinks Hofer Gilson & Lione (57) ABSTRACT

An ESD protective circuit protects an input or output of a monolithically integrated circuit. The ESD protective circuit has at least one bipolar transistor structure and one ESD protective element between two supply networks. The emitter of the bipolar transistor structure is electrically connected to the input or output, while the base is electrically connected to one of the two supply networks. The collector produces a current signal, which is used for triggering of the ESD protective element, when an ESD load occurs at the input or output.

17 Claims, 10 Drawing Sheets

ESD PROTECTIVE CIRCUIT WITH COLLECTOR-CURRENT-CONTROLLED TRIGGERING FOR A MONOLITHICALLY INTEGRATED CIRCUIT

PRIORITY

This application claims the benefit of priority to German Patent Application 10 2004 009 981.2, filed on Mar. 1, 2004, herein incorporated by reference in its entirety.

TECHNICAL FIELD

This application relates to an ESD protective circuit for protection of at least one input or output of a monolithically integrated circuit having two supply networks.

BACKGROUND

It is known that integrated circuits, in particular integrated circuits based on CMOS (Complementary Metal Oxide Semiconductor) circuit technology, must be protected against damaging electrostatic discharges. The aim in this case is to ensure that, in the case of a network of a circuit which can be electrostatically charged from the outside via a pad, electrostatic charging via a further network which is connected to the external environment can be dissipated via a low impedance to the outside again without any damage to the integrated circuit. This is done by means of ESD (Electrostatic Discharge) protective elements having appropriately broad and thus low-impedance supply buses, which are each arranged between two networks. ESD protective elements such as these fundamentally have a high impedance and form a low-impedance discharge path only in the event of ESD, that is to say when an electrostatic charge is supplied, so that it is impossible for a destructive discharge to take place via parallel-connected circuit parts. Semiconductor components, in particular diodes or thyristor structures, are typically used as ESD protective elements.

An ESD load can be simulated by the so-called HBM (Human Body Model). This is based on the assumption that an ESD load represents a high-impedance drive, that is to say a drive which forces a current to flow, for a pad.

The so-called diode ESD protective concept may be used for protection of an input or output of a monolithically integrated circuit. This concept is based on ESD protective diodes which are arranged at each input or output pad (I/O pad) of the circuit and are electrically connected not only to the respective I/O pad but also to one of the two supply networks, the so-called positive VDD network and the ground network (VSS network). When an ESD load occurs on the I/O pad, a discharge path is formed via one of the protective diodes depending on the polarity of the ESD pulse, dissipating the applied ESD charge to the VDD network or VSS network. If this VDD network or VSS network is not connected to the external environment, the respective other supply network being connected to it instead, an additional low-impedance path is also provided between the two supply networks. A further ESD protective element between the VDD network and the VSS network is used for this purpose and is also referred to as a power clamp, producing low-impedance charge equalization between the two supply networks. A power clamp such as this is frequently in the form of a thyristor structure.

One factor for the protective effect of the ESD protective concept described above is that the potential at the I/O pad is limited to non-critical values. If a specific critical magnitude of the potential at the I/O pad is exceeded, this results in a discharge via the circuit parts which are internally connected to the I/O pad. In the process, the gate oxide or diffusion layers of the I/O transistors is or are generally severally damaged or even destroyed. As semiconductor process technology becomes increasingly miniaturized, with the gate oxide thicknesses and extents of diffusion layers becoming ever smaller, the magnitude of the critical potential at an I/O pad is also decreasing. In order to ensure adequate voltage limiting in the event of ESD at the I/O pad, the power clamp can also be driven by means of a drive circuit that is set to be appropriately sensitive, and which is also referred to as a trigger circuit. The trigger circuit detects the presence of an ESD load, and triggers the power clamp in the event of ESD. In principle, there are two implementation options for the design of the trigger circuit: the trigger circuit may be designed in such a way that it detects an overvoltage between the supply networks. This can be achieved, for example, by current measurements on a diode chain. Alternatively, for example in the case of a so-called RC trigger, the transient voltage change between the supply networks can also be used for detection of an ESD load. Fundamentally, trigger circuits such as these have to take account of the fact that, in the event of an ESD load on an I/O pad, the additional diode path means that the voltage between the I/O pad and the VSS network is about 0.8–1.0 V greater than the voltage between the supply networks. The trigger threshold, that is to say the overvoltage or the transient voltage change at which the power clamp is triggered, is therefore set at an appropriately low level. Setting the trigger threshold to a low level such as this has the disadvantage that, when the integrated circuit is being operated at high temperatures, this can result in leakage currents via the trigger circuit and possibly also flowing via the power clamp, or the possibility of the power clamp being triggered inadvertently. In both situations, the functionality of the integrated circuit can be massively adversely affected: leakage currents cause an additional power loss, while inadvertent triggering results in a short circuit between the supply networks and can be rectified only with difficulty during operation of the circuit. Leakage currents frequently occur particularly when using overvoltage detection. Inadvertent triggering in the VDD network can be frequently observed. This is particularly true in the case of RC triggers, which are caused by detection of transient disturbance signals that are not ESD-dependent.

U.S. Pat. No. 5,576,557 describes an ESD protective circuit that is used for ESD protection of an input or output of a monolithically integrated circuit. The ESD protective circuit has a first and a second thyristor structure (SCR—Silicon Controlled Rectifier) that are designed as so-called low-voltage trigger SCRs (LVTSCR). An LVTSCR has an additional MOS transistor in order to trigger the thyristor. The anode and an anode-side control connection of the first thyristor structure are connected to the VDD network, while the cathode of the first thyristor structure is connected to the I/O pad to be protected, and a cathode-side control connection of the first thyristor structure is connected to the VSS network. Furthermore, the cathode and a cathode-side control connection of the second thyristor structure are connected to the VSS network, while the anode of the second thyristor structure is connected to the I/O pad to be protected and an anode-side control connection of the second thyristor structure is connected to the VDD network. This arrangement means that a total of two bipolar transistor structures which are inherent in the two thyristor structures are connected on the emitter side to the I/O pad. In the event of an ESD load on the I/O pad, one base/emitter junction of one of the two bipolar transistor structures is driven in the forward direction. The base potential change associated with this results in a drain-bulk breakdown of the LVTSCR-inherent MOS transistor. This drain-bulk breakdown results in triggering of the respective thyristor. This solution has the disadvantage that the triggering of the respective thyristor via the drain-bulk breakdown of an MOS transistor does not occur until the potential at the I/O pad has a specific magnitude, even if the magnitude of the potential is reduced further after the triggering. This specific potential magnitude is in the same order of magnitude as the breakdown voltage of the MOS transistor, that is to say 11 to 13 volts. If the potential magnitude before triggering of the thyristor is also only briefly above the critical magnitude mentioned above, damage to or destruction of the circuit which is connected to the I/O pad internally cannot be precluded despite the presence of an ESD protective circuit. The risk of ESD damage is in this case particularly high with modern semiconductor process techniques with structure sizes in the sub-0.1 micrometer range.

Figure 1:
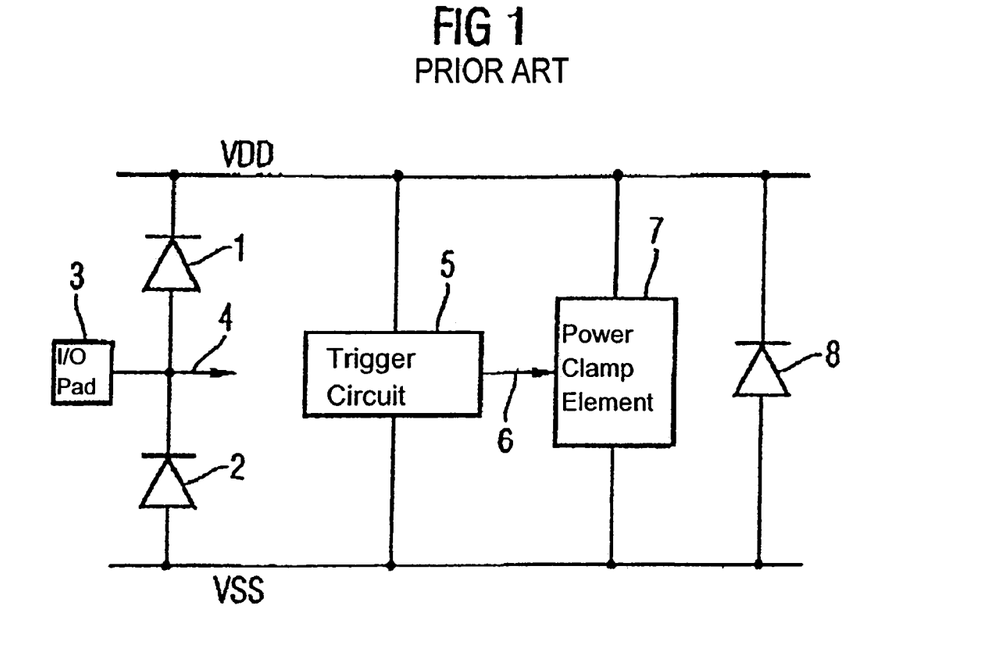
FIG. 1 shows an illustration of a prior art ESD protective circuit.

FIG. 1 shows an ESD protective circuit as known from the prior art for an input or output of an integrated circuit, based on the diode ESD protective concept. This has two diodes 1 and 2, which are electrically connected to an I/O pad 3 of the input and output of an internal circuit (indicated by the arrow 4), and in each case to one of the two supply networks VDD (positive potential) and VSS (ground potential). The diodes are connected such that they do not provide a conductive connection during normal operation of the integrated circuit. Furthermore, a trigger circuit 5 is connected between the supply networks VDD and VSS and identifies either the presence of an overvoltage or, alternatively, a transient voltage change between the supply networks as an indication of an ESD load. In response to the detection of an ESD load, the trigger circuit 5 drives a power clamp element 7 via a control signal 6. The control signal is used to trigger the power clamp element 7 which is connected between the supply networks, with a conductive connection being formed between the supply networks VDD and VSS when the power clamp element 7 is triggered. Furthermore, a power clamp diode 8 is also provided between the supply networks VDD and VSS.

In principle, a distinction can be drawn between four types of ESD load at an I/O pad: an ESD load at an I/O pad with a positive voltage polarity to the externally short-circuited VSS network (PS-ESD load); an ESD load at an I/O pad with a positive voltage polarity to the externally short-circuited VDD network (PD-ESD load); an ESD load at an I/O pad with a negative voltage polarity to the externally short-circuited VSS network (NS-ESD load); and an ESD load at an I/O pad with a negative voltage polarity to the externally short-circuited VDD network (ND-ESD load).

In the event of a PS-ESD load, the diode 1 becomes forward-biased, and the trigger circuit 5 identifies an ESD load on the basis of the transient voltage change or the overvoltage, and triggers the power clamp element 7 which, after triggering, produces a low-impedance connection between the supply networks VDD and VSS. In the case of an ESD load such as this, the voltage between the I/O pad and VSS network is limited to low values by the low-impedance discharge path.

In the event of a PD-ESD load, the diode 1 becomes forward-biased, so that a low-impedance discharge path is created between the I/O pad and the externally short-circuited VDD network. This limits the voltage between the I/O pad and the VDD network.

In the event of an ND-PSD load or an NS-ESD load, a low-impedance discharge path is formed in an analogous manner to that for a PS-ESD load or a PD-ESD load, with the diode 2 then being forward-biased rather than the diode 1.

The diode ESD concept illustrated in FIG. 1 is based on monitoring (monitoring of the overvoltage or the voltage change) of the voltage between the VDD network and the VSS network.

BRIEF SUMMARY

An ESD protective circuit is provided which offers even more reliable protection against ESD loads. In particular, in the event of an ESD load at an input or output of a monolithically integrated circuit, a low-impedance ESD discharge path is provided as early as possible, that is to say even while the magnitude of the potential of the input or output is low, so as to reliably prevent damage to the circuit to be protected. Leakage currents or inadvertent triggering are also avoided.

In one embodiment, the ESD protective circuit is used for protection of at least one input or output of a monolithically integrated circuit having two supply networks, for example, VDD and VSS. This ESD protective circuit has at least one bipolar transistor structure with an emitter, a base and a collector. The expression transistor structure indicates the presence of npn or pnp structures, for example in the case of parasitic transistors, rather than the use explicit transistors. Furthermore, the ESD protective circuit contains an ESD protective element which is electrically connected to both supply networks. In this case, the emitter is electrically connected to the input or output, while the base is electrically connected to one of the two supply networks. The collector produces a current signal, which is used to trigger the ESD protective element, when an ESD load occurs at the input or output.

The triggering of an ESD protective element is initiated by the collector current through the at least one bipolar structure. Breakdown of a semiconductor junction (for example drain-bulk in an MOS transistor) as in U.S. Pat. No. 5,576,557 may be avoided. To this extent, the use of such semiconductor structures may be similarly avoided. The use of the collector current as a trigger signal during an ESD load results in the ESD protective element being triggered at an early stage, that is to say while the magnitude of the potential at the input or output is still low. The ESD protective circuit thus prevents a rise in the magnitude of the potential to such a high value which only then allows breakdown at a semiconductor structure and thus the generation of a trigger signal for an ESD protective element. On the other hand, the circuit prevents additional leakage currents being caused in the ESD protective circuit during operation of the integrated circuit, since no overvoltage is detected.

In principle, there is a (parasitic) coupling capacitance between the two supply networks, for example VDD and VSS. This coupling capacitance is formed, for example, from the parasitic coupling capacitance which is always present in the circuit to be protected and, optionally, further capacitors which are added in order to block the operating voltage. In the event of a sudden ESD load at the input or output, a dynamic displacement current or base current occurs, which flows via the base-emitter junction of the bipolar transistor structure and via the coupling capacitance, which has a low impedance for a sudden signal. In this case, a diode forward voltage is dropped across the base-emitter junction. The displacement current also results in a corresponding collector current to the bipolar transistor structure. This collector current signal is used to trigger the ESD protective element. Depending on whether the bipolar transistor structure is an npn or pnp transistor structure, the collector current signal may be positive or negative.

The ESD protective circuit uses only a slight increase in additional space in the layout of the overall circuit. This is due to the fact that scarcely any additional surface area is required to extend a protective diode to a bipolar transistor structure, and that coupling capacitances which are present in any case can be used.

The bipolar transistor structure may be balanced, that is to say the emitter and collector may be designed identically. The expressions emitter and collector that are used in the application text are thus defined on the basis of the function of the connections in the event of ESD: for an npn transistor structure, a positive current flows into the collector and out of the emitter while, in contrast, the relationships are precisely the opposite for a pnp transistor structure.

It should also be mentioned that the ESD protective element and the bipolar transistor structure do not necessarily have to be separate structures. In particular, it is within the scope of the application for the bipolar transistor structure to also be a component of the ESD protective element.

In one embodiment, the bipolar transistor structure is a pnp transistor structure. In this case, the base of the pnp transistor structure is electrically connected to the positive supply network of the two supply networks. In another embodiment, the bipolar transistor structure is an npn transistor structure, with the base of the npn transistor structure being electrically connected to the negative supply network of the two supply networks. In this case, the VDD network corresponds to the positive supply network, and the VSS network to the negative supply network. In addition, two bipolar transistor structures, that is to say one npn transistor structure and one pnp transistor structure, can be provided for protection of an input or output. These are then connected as described above. The use of two bipolar transistor structures protects the input or output against both positive and negative ESD loads.

The ESD protective element may have at least one thyristor structure. For the purposes of the application, the expression thyristor structure means any four-layer diode comprising four doped layers. A thyristor structure in this case has the advantage over other types of ESD protective elements that the charge is dissipated with a particularly low impedance owing to the thyristor-specific current positive feedback. Furthermore, a thyristor structure in principle offers the capability via an additional control connection, which is not absolutely essentially provided for the purposes of the application, for the thyristor structure to be triggered in a controlled manner largely independently of the voltage applied between the anode and cathode. In this case, the thyristor structure may be formed by four doped layers, or may be formed from a suitable circuit in connection of a pnp and npn transistor structure, on the basis of the transistor-based thyristor equivalent circuit. With regard to the design and method of operation of a thyristor, in particular with respect to the transistor-based thyristor equivalent circuit, reference should be made to the textbook "Elektronische Bauelemente" [Electronic Components] by Michael Reisch, Springer-Verlag, 1998, Section 10, pages 949 to 953, with the text reference cited above being included by reference in the disclosure content of this application.

In this case, the cathode side of the thyristor structure can be controlled via a cathode-side control connection, and the collector of the pnp transistor structure is electrically connected to the cathode-side control connection. The thyristor structure can also be controlled on the anode side via an anode-side control connection, and if the collector of the npn transistor structure is electrically connected to the anode-side control connection. Furthermore, it is also possible to provide for the thyristor structure to be controllable and to be connected both on the cathode side and on the anode side as described above. For the purposes of the application, the expression anode-side control means that the control connection is connected to the n-doped zone adjacent to the p-doped zone of the anode. In contrast to this, cathode-side control for the purposes of the application means that the control connection is connected to the p-doped zone adjacent to the n-doped zone of the cathode, in the sense of a four-layer diode. The cathode-side and simultaneous anode-side control capability for the thyristor structure mean that the collector current signal of both the pnp transistor structure and of the npn transistor structure can be used directly, that is to say without inversion, for triggering of the thyristor structure. The collector current signal can optionally be converted by means of the resistance to a voltage signal which is applied to the control input.

As has already been mentioned above, the bipolar transistor structure may also alternatively be a component of the ESD protective element. In a corresponding manner, in the case of one embodiment, the pnp transistor structure is a component of the at least one thyristor structure. Alternatively, it is possible to provide for the npn transistor structure to be a component of the at least one thyristor structure. The ESD protective element may have two thyristor structures, with the pnp transistor structure being a component of the first thyristor structure, and the npn transistor structure being a component of the second thyristor structure.

Since the bipolar transistor structure is already a component of the thyristor structure, the ESD discharge path is shorter by one diode path than that of separate structures, so that the maximum potential occurring at the input or output is reduced by one diode forward voltage. The protective effect of the ESD protective circuit is accordingly increased.

A coupling capacitor, in particular a coupling capacitor with a capacitance of more than 1 pF, may be connected between the two supply networks. The use of an additional capacitor (in addition to the parasitic capacitance which is present in any case) correspondingly increases the resultant total coupling capacitance. In this case, the greater the total coupling capacitance between the two supply networks, the less is the magnitude of the impedance between the supply networks, the greater, in consequence, is the magnitude of the dynamic displacement current, and the greater, in consequence, is the amplitude of the collector current signal. In this case, a collector current signal with a large magnitude is advantageous for early triggering. On the basis of simulations, it was found with an ESD pulse rise time of 10 ns (based on the HBM model) that the trigger threshold can be virtually completely suppressed for capacitance values of more than 1 pF.

During operation of the monolithically integrated circuit, the input or output is decoupled from all of the diffusion wells in the ESD protective circuit via pn junctions which are in each case reverse-biased. This may be used when the ESD protective circuit is designed for protection of an input or output such as this via which radio-frequency signals are transmitted. Since the input or output is coupled only with a high impedance to a diffusion well via the reverse-biased pn junctions, it is possible to ensure that the parasitic capacitance which is caused by the ESD protective circuit and acts at the input or output is only very small. The integrity of the radio-frequency signal is thus maintained. Furthermore, the decoupling of the input or output and the small parasitic capacitances which result in this way, in particular between the input and output and the supply networks, mean that the thyristor structure will not accidentally be triggered by radio-frequency signals at the input or output. In addition, the influence of the ESD protective circuit on radio-frequency signals at the input or output can be taken into account realistically in a circuit simulator, since the base-emitter diode junctions which are connected to the input or output can be modelled very exactly up to very high frequencies.

According to one embodiment of the ESD protective circuit according to the invention, this circuit is designed for ESD protection of a number of inputs and/or outputs. In this case, at least one bipolar transistor structure as described above is provided for each input or output. In this case, a single ESD protective element is used between the two supply networks for the two or more inputs and/or outputs. When an ESD load occurs at an input or output, the collector of the respective bipolar transistor structure produces a current signal which is used to trigger the ESD protective element. This advantageous refinement of the ESD protective circuit offers the advantage that a bipolar structure is provided locally, that is to say directly in the vicinity of the I/O pad, for each input or output, although the ESD protective element can be used for simultaneous protection of the two or more inputs and/or outputs.

The foregoing summary has been provided only by way of introduction. Nothing in this section should be taken as a limitation on the following claims, which define the scope of the invention.

BRIEF DESCRIPTION OF THE DRAWINGS

The invention will be explained in more detail in the following text using a number of exemplary embodiments and with reference to the drawings, in which:

FIG. 7b shows a schematic illustration of the layout of the ESD protective circuit shown in FIG. 7a;

DETAILED DESCRIPTION OF THE PREFERRED EMBODIMENTS

Figure 2:
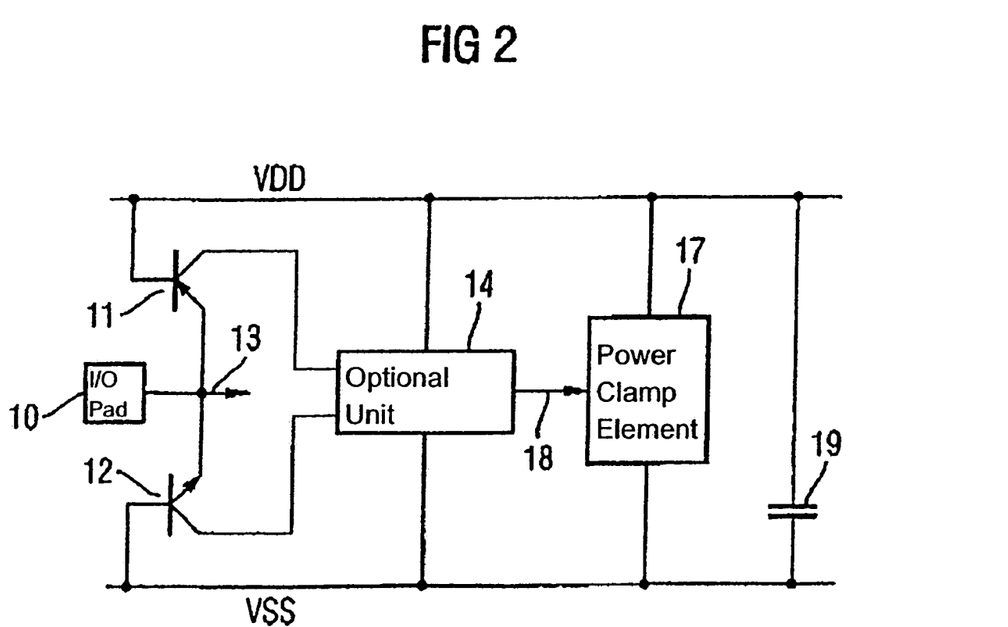
FIG. 2 shows an outline illustration of an ESD protective circuit according to one embodiment of the invention.

FIG. 2 illustrates an ESD protective circuit according to one embodiment of the invention. One difference from the ESD protective circuit shown in FIG. 1 is that the diodes 1 and 2 are in the form of base-emitter diodes of two bipolar transistor structures 11 and 12. The pnp transistor structure 11 is in this case electrically connected on the emitter side to the I/O pad 10 to be protected, and on the base side to the VDD network. The npn transistor structure 12 is analogously connected on the emitter side to the pad 10 to be protected, and on the base side to the supply network VSS. The collectors of the pnp transistor structure and of the npn transistor structure are connected to an optional unit 14, which converts the collector current signals to voltage signals, combines them and optionally amplifies them. The unit 14 drives a power clamp element 17 via the signal 18. Furthermore, a coupling capacitance 19 is connected between the supply networks VDD and VSS, which, by way of example, is a parasitic capacitance or the capacitance of a blocking capacitor. Since a power clamp diode 8 in FIG. 1 does not significantly contribute to the ESD protective effect of the protection paths which will be considered in the following text from the I/O pad to VDD or VSS, FIG. 2 and the subsequent figures do not specifically illustrate a power clamp diode such as this. However, this can be added in each of these figures in an analogous manner to that shown in FIG. 1.

A square-wave PS-ESD load on the I/O pad 10 results in a transient displacement current which flows from the base of the pnp transistor structure 11 via the coupling capacitance 19, which has a low impedance for strong signal components. The current gain provided by the pnp transistor structure 11 results in a corresponding positive collector current, which flows out of the collector of the pnp transistor structure 11. This collector current signal is preprocessed in the unit 14, so that the power clamp element 17 is triggered via the output signal 18 from the unit 14. This results in a low-impedance ESD discharge path being formed between the I/O pad 10 and the supply network VSS, limiting the potential at the I/O pad 10.

In the event of a PD-ESD load, the base-emitter diode in the pnp transistor structure becomes forward-biased in a similar manner to that shown in FIG. 1, thus resulting in a low-impedance discharge path between the I/O pad and the externally short-circuited VDD network.

In the event of an ND-ESD load and an NS-ESD load, a low-impedance discharge path is formed in an analogous manner to that in the event of a PS-ESD load or PD-ESD load, with this process being triggered by the npn transistor structure 12 rather than by the pnp transistor structure 11. In this case, the current flows in the opposite directions.

Figure 3A:
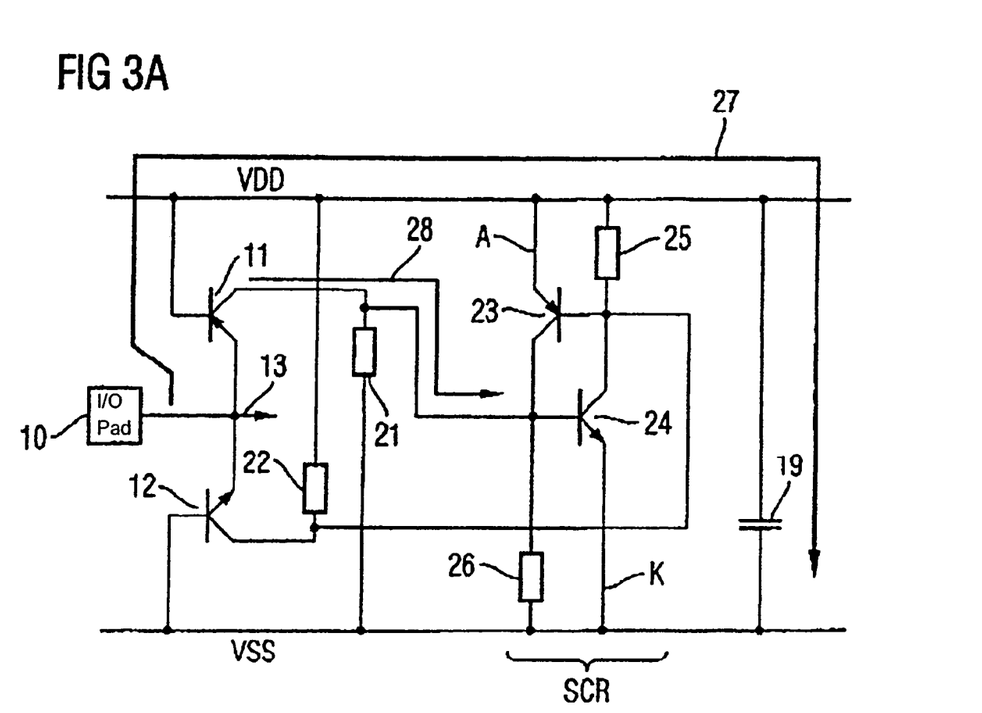
FIG. 3a shows a detailed illustration of an ESD protective circuit according to one embodiment of the invention before triggering.

FIG. 3a shows a detailed illustration of an ESD protective circuit according to one embodiment of the invention. The structures that are provided with the same reference symbols in FIG. 2 and FIG. 3a correspond to one another. FIG. 3a shows an explicit implementation for the unit 14 and for the power clamp element 17 from FIG. 2. As can be seen from FIG. 3a, the collector current signal from the pnp transistor structure 11 and from the npn transistor structure 12 is converted via the resistance 21 or via the resistance 22, respectively, to a voltage signal, with the resistance 21 connecting the collector of the pnp transistor 11 to the VSS network, and the resistance 22 connecting the collector of the npn transistor 12 to the VDD network. Typical values for these resistances are in the range from a few ohms up to several kilohms. The voltage signals from the resistance 21 and from the resistance 22 are supplied as control signals on the cathode side and on the anode side, respectively, to a thyristor SCR, which is connected between the supply networks VDD and VSS. A thyristor SCR such as this can be subdivided on the basis of the thyristor equivalent circuit into a pnp transistor structure 23 and an npn transistor structure 24. Furthermore, the thyristor SCR has two resistances 25 and 26, with the bases of the pnp transistor structure 23 and of the npn transistor structure 24 being connected to the supply networks via the resistances 25 and 26, respectively. The cathode-side control connection of the thyristor SCR is thus connected to the base of the npn transistor structure 24, while the anode-side control connection of the thyristor is connected to the base of the pnp transistor structure 23.

FIG. 3a also shows the ESD discharge path as indicated by an arrow 27 during the first nanoseconds following a PS-ESD load, based on the HBM model. As has already been described above, a displacement current initially flows for a short time from the base-emitter diode in the pnp transistor structure 11 and onwards via the coupling capacitance 19, and then flows away via the externally short-circuited VSS network. There is therefore a collector current signal (indicated by the arrow 28), which triggers the thyristor SCR. The illustrated current/voltage conversion by the resistance 21 (and by the resistance 22 analogously as well), is in this case optional for triggering of the thyristor SCR. If a resistance 21 is set, this results in the thyristor SCR being driven by a voltage; if this is not set, the thyristor SCR is driven by current. The current or voltage signal for driving the thyristor SCR makes the base-emitter diode in the npn transistor structure 24 forward-biased. This results in an increase in the collector current flowing into the npn transistor structure 24, so that a voltage is dropped across the resistance 25. This voltage switches on the pnp transistor structure 23, so that a positive current flows out of the collector of the pnp transistor structure 23 and further increases the collector current through the npn transistor structure 24 by virtue of the additional voltage drop across the resistance 26. When the thyristor SCR is triggered, this thus results in a positive feedback process, thus creating a very low-impedance connection between the VDD network and the VSS network. In principle, the resistances 25 and 26 may also be omitted; this results in pure current positive feedback, that is to say the positive or negative collector current in the first transistor structure flows into the base of the other transistor structure, and vice versa.

Figure 3B:
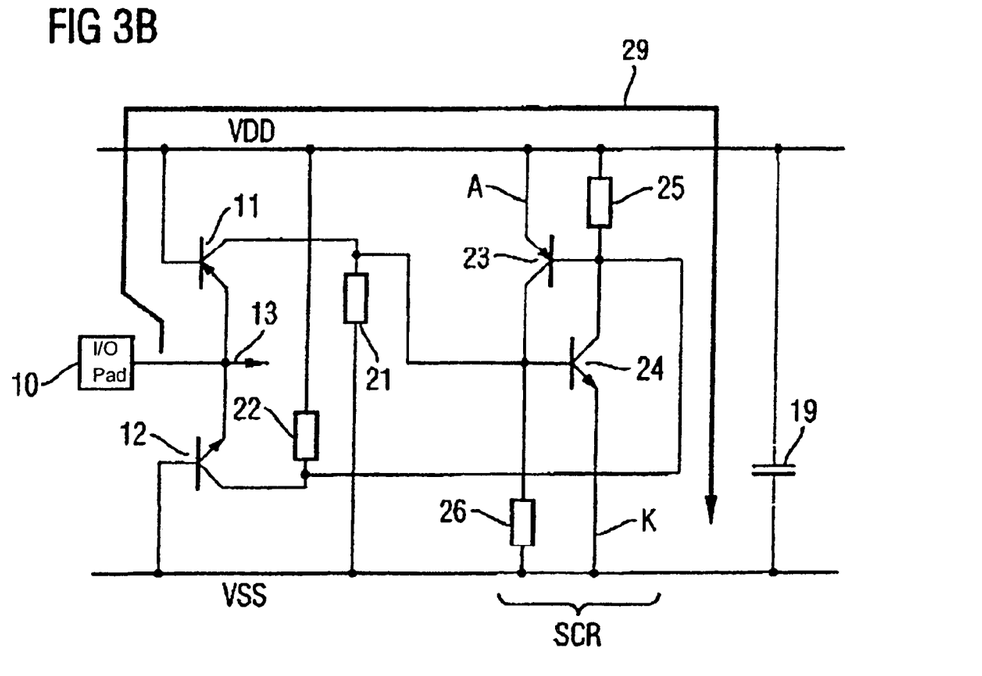
FIG. 3b shows a detailed illustration of the ESD protective circuit according to one embodiment of the invention and as shown in FIG. 3a after triggering.

FIG. 3b shows the ESD protective circuit according to one embodiment of the invention and as illustrated in FIG. 3a after the triggering of the thyristor SCR. The ESD discharge path indicated by the arrow 29 extends via the base-emitter diode in the pnp transistor structure 11 and via the thyristor SCR. This results in a very low-impedance connection between the I/O pad 10 and the supply network VSS. When an ND-ESD load occurs, the anode side of the thyristor is triggered via the collector current signal from the npn transistor 12 in an analogous manner to that in the event of a PS-ESD load. The current direction of the collector current through the pnp transistor structure 12 is in this case precisely the opposite to the current direction of the collector current through the npn transistor structure 1 when a PS-ESD load occurs.

Figure 4A:
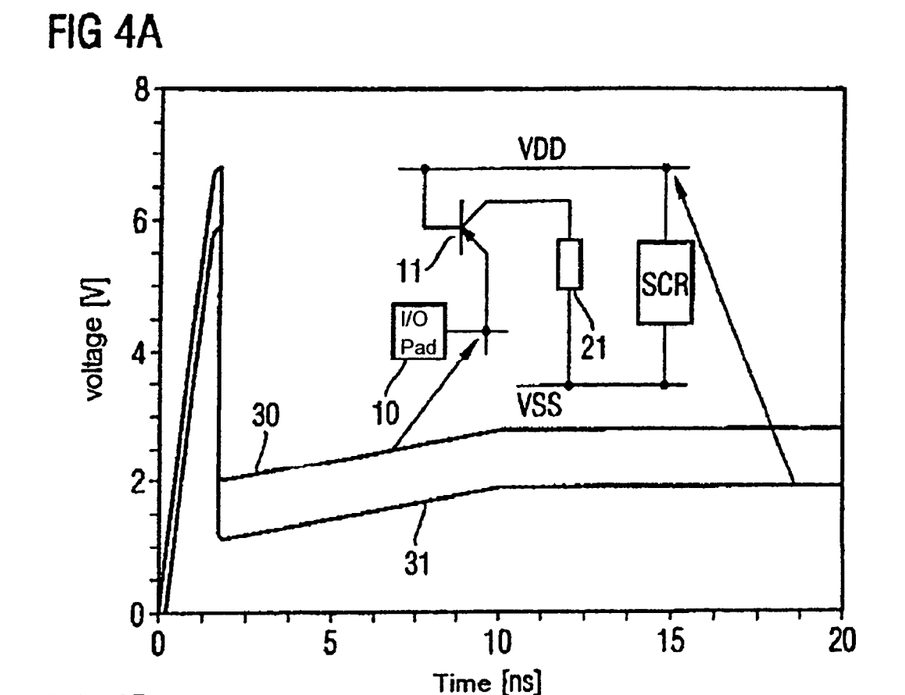
FIG. 4a shows an illustration of the simulated voltage profile at the I/O pad and at the VDD network in comparison to the VSS network without the thyristor being driven according to one embodiment of the invention.
Figure 4B:
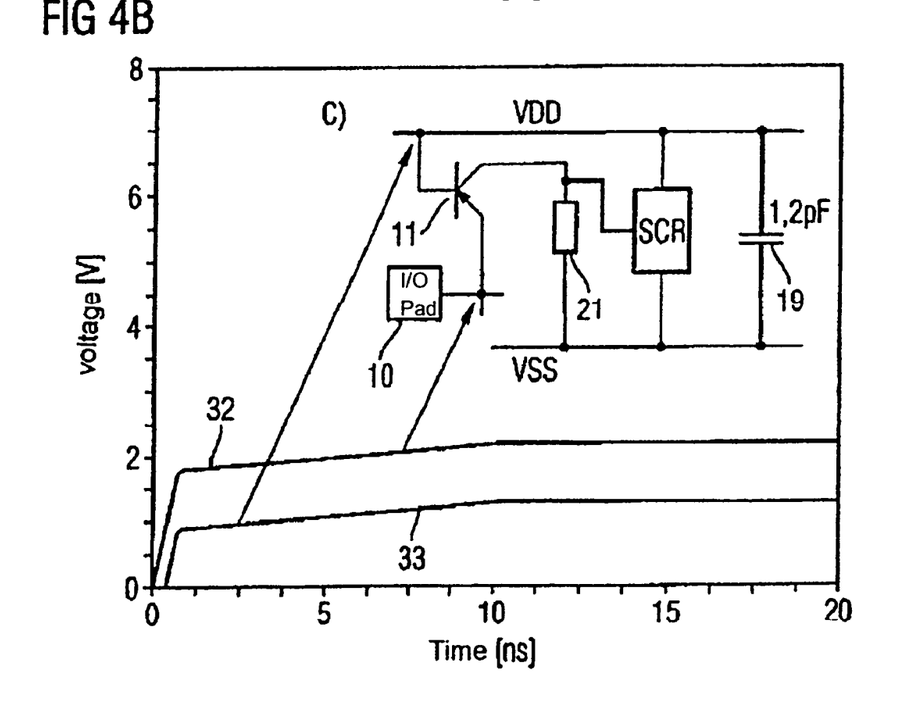
FIG. 4b shows an illustration of the simulated voltage profile at the I/O pad and at the VDD network in comparison to the VSS network with the thyristor being driven according to one embodiment of the invention and with a large coupling capacitance.
Figure 4C:
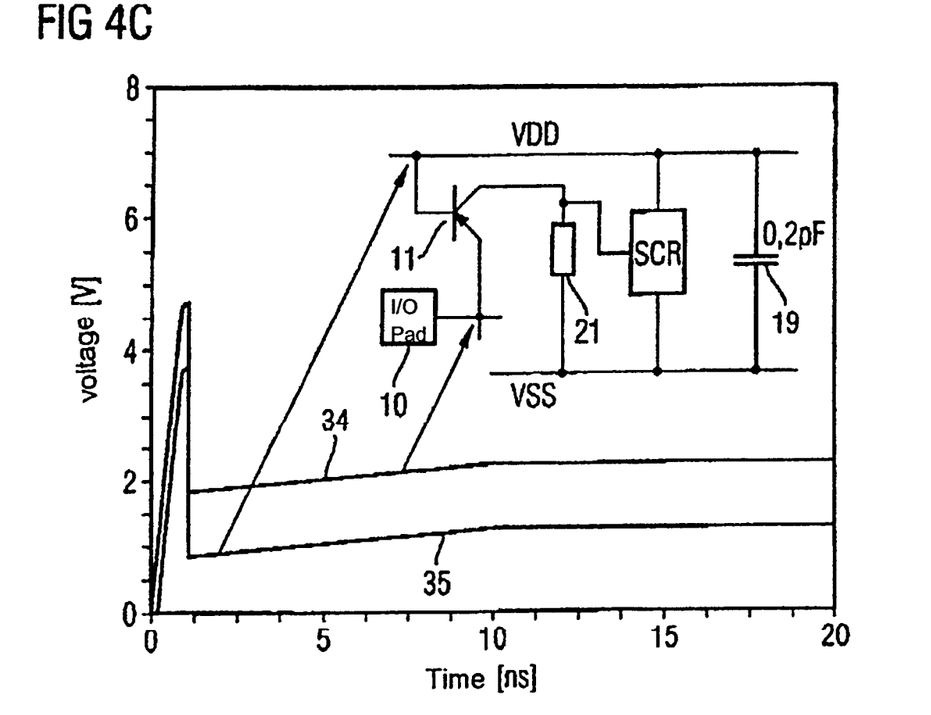
FIG. 4c shows an illustration of the simulated voltage profile at the I/O pad and at the VDD network in comparison to the VSS network with the thyristor being driven according to one embodiment of the invention and with a small coupling capacitance.

The principle of operation of the drive according to one embodiment of the invention for the thyristor SCR can be illustrated on the basis of the simulation results shown in FIG. 4a to FIG. 4c. The simulations illustrated in FIG. 4a to FIG. 4c are based on the assumption of a PS-ESD load in the form of a square-wave current pulse with a rise time of 10 ns, a pulse duration of 100 ns, and a current level of 1 A. The simulation shown in FIG. 4a is based on the ESD protective circuit illustrated in FIG. 3a. In this case, however (as indicated at the top right of FIG. 4a), the connection of the collector of the pnp transistor structure 11 according to the invention to the thyristor SCR is disconnected, that is to say the collector current signal from the pnp transistor structure 11 according to the invention has no effect on a control input of the thyristor SCR. The curves 30 and 31 illustrated in FIG. 4a represent the transient profile of the voltage between the I/O pad 10 and the VSS network, and between the VDD network and the VSS network. The curve 30 shows that a voltage of more than 6 V is dropped between the I/O pad 10 and the VSS network approximately at the time t=1.5 ns. This voltage is sufficient to trigger the thyristor SCR as a result of the voltage difference resulting from it at the anode and of the cathode, and the voltage can then be limited to a safe level of below 4 V. The brief voltage load of 6 V may, however, itself cause an irreversible breakdown in the circuit to be protected.

If the simulation shown in FIG. 4b is based on an ESD protective circuit as shown in FIG. 3a with an intact connection between the collector of the pnp transistor structure 11 and the thyristor SCR, with the magnitude of the coupling capacitance 19 also being 1.2 pF, this results in the transient profiles 32 and 33 of the voltage between the I/O pad 10 and the VSS network and between the VDD network and the VSS network, respectively. The displacement current according to the embodiment of the invention via the base-emitter junction of the pnp transistor structure 11 and the corresponding collector current signal result in the thyristor SCR being triggered at an early stage, that is to say even at a time t=0.5 ns. If the coupling capacitance 19 between the supply networks VDD and VSS is sufficiently large, the voltage from the I/O pad 10 to the VSS network is limited to considerably less than 2.5 V, so that a critical voltage never occurs between the I/O pad and the VSS network.

If the simulation shown in FIG. 4c is based on an ESD protective circuit as shown in FIG. 3a with an intact connection between the collector of the pnp transistor structure 11 and the thyristor SCR, with the magnitude of the coupling capacitance 19 furthermore being only 0.2 pF, this results in the transient profiles 34 and 35 of the voltage between the I/O pad 10 and the VSS network, and between the VDD network and the VSS network, respectively. The profiles 34 and 35 show a trigger threshold of barely 5 V achieved between the I/O pad 10 and the VSS network, and of barely 4 V between the VDD network and the VSS network triggers the SCR. This demonstrates that if the magnitude of the coupling capacitance 19 has a low value (much less than 1.2 pF), the value of the displacement current is low, so that the thyristor SCR is not triggered at an early stage. Conversely, if the magnitude of the coupling capacitance 19 has a high value (greater than 1.0 pF), the value of the displacement current is high, so that the thyristor SCR is triggered at an early stage. In typical monolithically integrated circuits, the value of the coupling capacitance is considerably higher than 1.2 pF owing to the parasitic capacitances and the operating voltage blocking, so that the ESD protective circuit according to the embodiment of the invention can in general be used without any restriction. Coupling capacitance which is present in any case may be adequate although additional coupling capacitance installed only for ESD protective purposes between the supply networks may be added.

Figure 5:
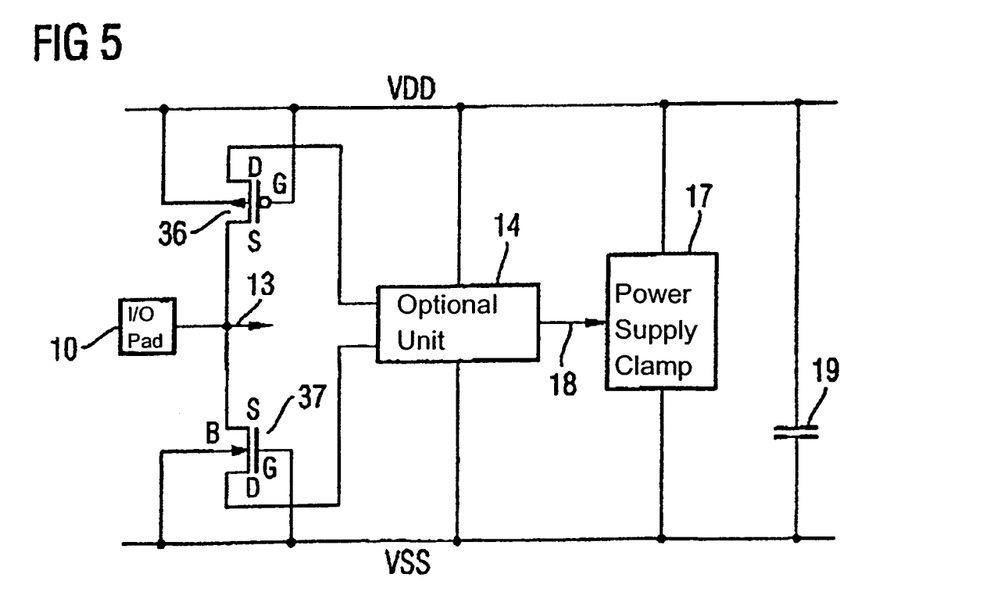
FIG. 5 shows an outline illustration of an ESD protective circuit according to one embodiment of the invention, analogous to FIG. 2, using parasitic bipolar transistors of MOS transistors.

FIG. 5 shows the ESD protective circuit as shown in FIG. 2 using parasitic bipolar transistors of MOS transistor structures. The structures provided with the same reference symbols in FIG. 2 and FIG. 5 correspond to one another. The pnp transistor structure 11 illustrated in FIG. 2 and the npn transistor structure 12 are shown in FIG. 5 as parasitic bipolar transistors of a PMOS and NMOS transistor 36 and 37, respectively. In this case, the n-doped bulk connection B of the PMOS transistor structure 36 and the p-doped bulk connection B of the NMOS transistor structure 37 correspond to the base of the pnp transistor structure 11 and the base of the npn transistor structure 12, respectively. The p-doped source connection S and the p-doped drain connection D of the PMOS transistor structure 36 respectively correspond to the emitter and the collector of the pnp transistor 11. The n-doped source connection S and the n-doped drain connection D of the NMOS transistor structure 37 respectively correspond to the emitter and the collector of the npn transistor 11. The method of operation of the parasitic bipolar transistors is in this case identical to the method of operation of the bipolar transistors 11 and 12 illustrated in FIG. 2. Not only the bipolar transistors 11 and 12 illustrated in FIG. 2 but all of the bipolar transistor structures described in the application can be replaced by parasitic bipolar transistors of MOS transistors. The use of parasitic bipolar transistors of MOS transistors permits the ESD protective circuit to likewise be produced using pure CMOS technology, that is to say without explicit bipolar transistors in a technology-dependent component library.

Figure 6A:
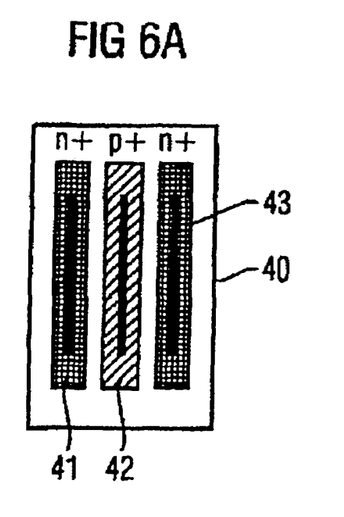
FIG. 6a shows an illustration of the layout of an npn transistor structure.
Figure 6B:
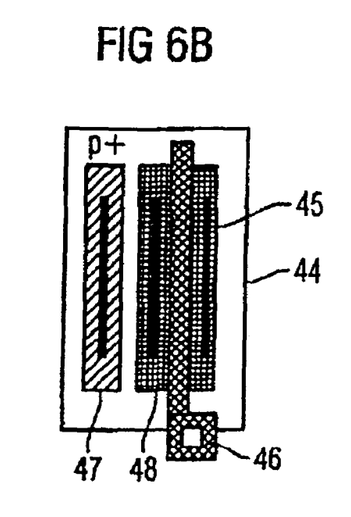
FIG. 6b shows an illustration of the layout of an NMOS transistor structure with a parasitic npn transistor structure.

FIG. 6a shows the layout of a lateral npn transistor structure. By way of example, the npn transistor structure 12 shown in FIG. 2 may have a layout such as this. An n+-doped emitter strip 41, a p+-doped base strip 42 and an n+-doped collector strip 43 are located in a p-doped well 40. In contrast, FIG. 6b shows the layout of an NMOS transistor structure, for example the NMOS transistor structure 37 shown in FIG. 5. The two n+-doped diffusion regions 45 and 48 for the source region and the drain region, respectively, between which a conductive channel is formed during operation of the NMOS transistor are located in a p-doped well 44. The gate connection 46 is arranged above the channel. Furthermore, the figure shows the p+-doped bulk connection 47. The base of the parasitic npn transistor in the NMOS transistor structure corresponds to the bulk connection 47, the emitter corresponds to the source connection 45, and the collector corresponds to the drain connection 48. The typical MOS transistor widths in the MOS transistor structures 36 and 37 in FIG. 5 are between 20 µm and 200 µm. The bipolar transistor structures described in the application have similar lengths. The current increase in the explicit or parasitic bipolar transistors illustrated in FIGS. 6a and 6b is typically in the range between 0.1 and 10.

Figure 7A:
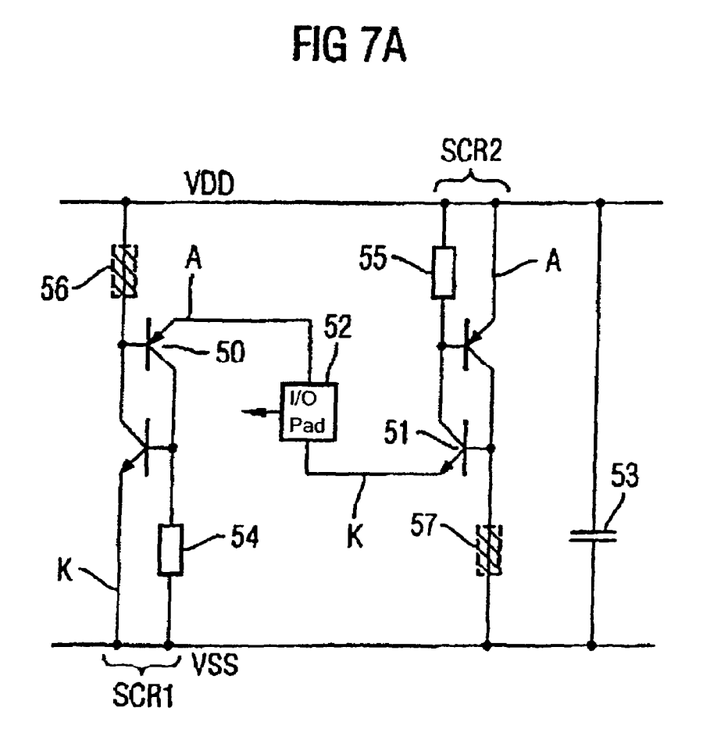
FIG. 7a shows an illustration of a further ESD protective circuit according to the invention, with two pad-side bipolar transistor structures integrated in two thyristors.

FIG. 7a shows the circuit diagram of a further ESD protective circuit according to the invention, with the pad-side bipolar transistor structures 50 and 51 being integrated in two thyristors SCR1 and SCR2. In this case, the pnp transistor structure 50 and the npn structure 51 carry out the function of the pad-side bipolar transistor structures 11 and 12, respectively (see, for example, FIG. 3a). At the same time, the bipolar structures are a component of the two thyristors SCR1 and SCR2. In this case, the pnp transistor structure 50 corresponds to the pnp transistor in the thyristor equivalent circuit, while the npn transistor structure 51 corresponds to the npn transistor in the thyristor equivalent circuit. The bipolar structures need not be in the form of autonomous bipolar transistors with explicit base, emitter and collector connections in this case, or anywhere else in the application, but may be part of a higher-level structure, such as a thyristor in this case. Conversely, however, it is also feasible for the thyristors SCR1 and SCR2 to be formed by transistor structures (explicit bipolar structures or MOS structures). The emitters of the pnp transistor structure 50 and of the npn transistor structure 51 are in each case connected to the I/O pad 52 to be protected. At the same time, the emitter of the pnp transistor structure 50 forms the anode A of the thyristor SCR1, while the emitter of the npn transistor structure 51 forms the cathode K of the thyristor SCR2. Furthermore, the cathode K of the thyristor SCR1 is connected to the VSS network, while in contrast the anode A of the thyristor SCR2 is connected to the VDD network. In addition, two resistances 54 and 55, respectively, are provided in each case analogously to the resistances 25 and 26 (see FIG. 3a) although these are optional, as has already been stated with respect to the resistances 25 and 26. The base of the pnp transistor structure 50 is electrically connected to the VDD network while, in contrast, the base of the npn transistor structure 51 is electrically connected to the VSS network. The electrical resistances in these two connections correspond to the equivalent resistances 56 and 57. Furthermore, a coupling capacitance 53 is provided between the VDD network and the VSS network, and corresponds to the coupling capacitance 19.

When a PS-ESD load occurs, a displacement current flows via the base-emitter diode in the pnp transistor element 50 and onwards via the coupling capacitance 53. This results in a collector current flow out of the pnp transistor element 50, as a result of which the thyristor SCR1 is triggered in a similar manner to that already described for FIG. 3a. This results in an ESD discharge path between the I/O pad 52 and the externally short-circuited VSS network.

When a PD-ESD load occurs, an ESD discharge path is formed between the I/O pad 52 and the externally short-circuited VDD network via the base-emitter diode in the pnp transistor element 50.

When an NS-ESD load occurs, an ESD discharge path is formed between the I/O pad 52 and the externally short-circuited VSS network via the base-emitter diode in the npn transistor element 51.

When an ND-ESD load occurs, a displacement current flows via the base-emitter diode in the npn transistor element 51 to the base, coming from the coupling capacitance 53. This results in a collector current flow into the npn transistor element 51, thus triggering the thyristor SCR2 in a similar manner to that already described with reference to FIG. 3a. This results in an ESD discharge path between the I/O pad 52 and the externally short-circuited VSS network.

Since the bipolar transistor structures 50 and 51 are already components of the respective thyristor structures SCR1 and SCR2, the ESD discharge path is shorter by one diode junction than separate structures, so that the maximum magnitude of the potential at the I/O pad is reduced by the diode forward voltage. The protective effect of the ESD protective circuit is accordingly improved. If the equivalent resistances 56 and 57 are not sufficiently small (greater than a few ohms), the protective effect of the base-emitter diodes may not be sufficient, owing to the increased voltage drop in the event of PD or NS-ESD load. In this case, the ESD protective circuit as shown in FIG. 7a may have further protective diodes added to it, connected in parallel with the base-emitter diodes.

Figure 7B:
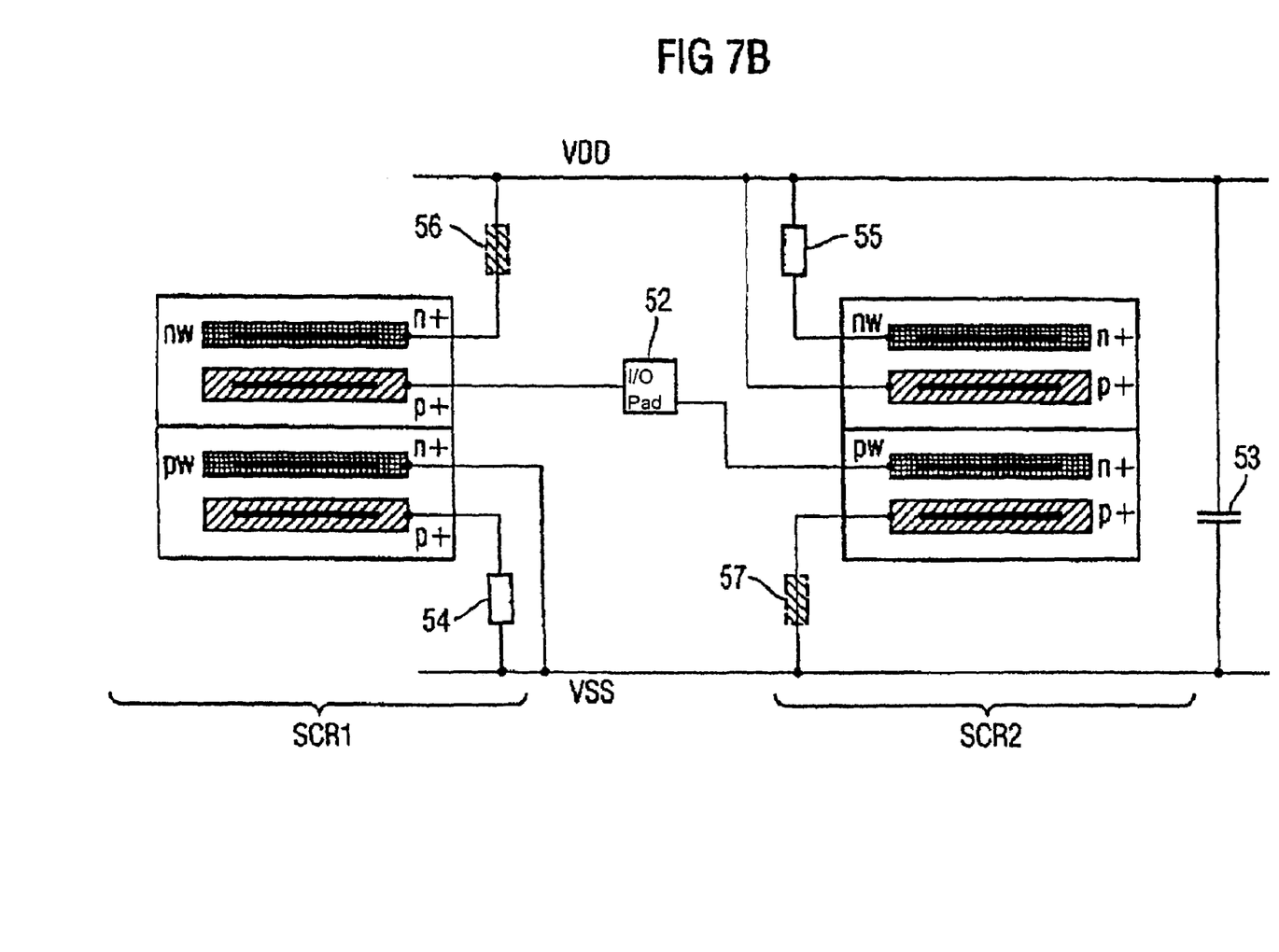

FIG. 7b shows a schematic illustration of the layout of the ESD protective circuit shown in FIG. 7a. The structures which are provided with the same reference symbols in FIGS. 7a and 7b correspond to one another. As can be seen from FIG. 7b, the n-well and p-well in the thyristors SCR1 and SCR2 respectively, are decoupled from the I/O pad by the reverse-biased pn junction during operation of the circuit. The decoupling can also be ensured in the case of the implementation of the ESD protective circuits according to the invention that have already been described above. Decoupling means that the ESD protective circuit is particularly suitable for radio-frequency applications.

Figure 8A:
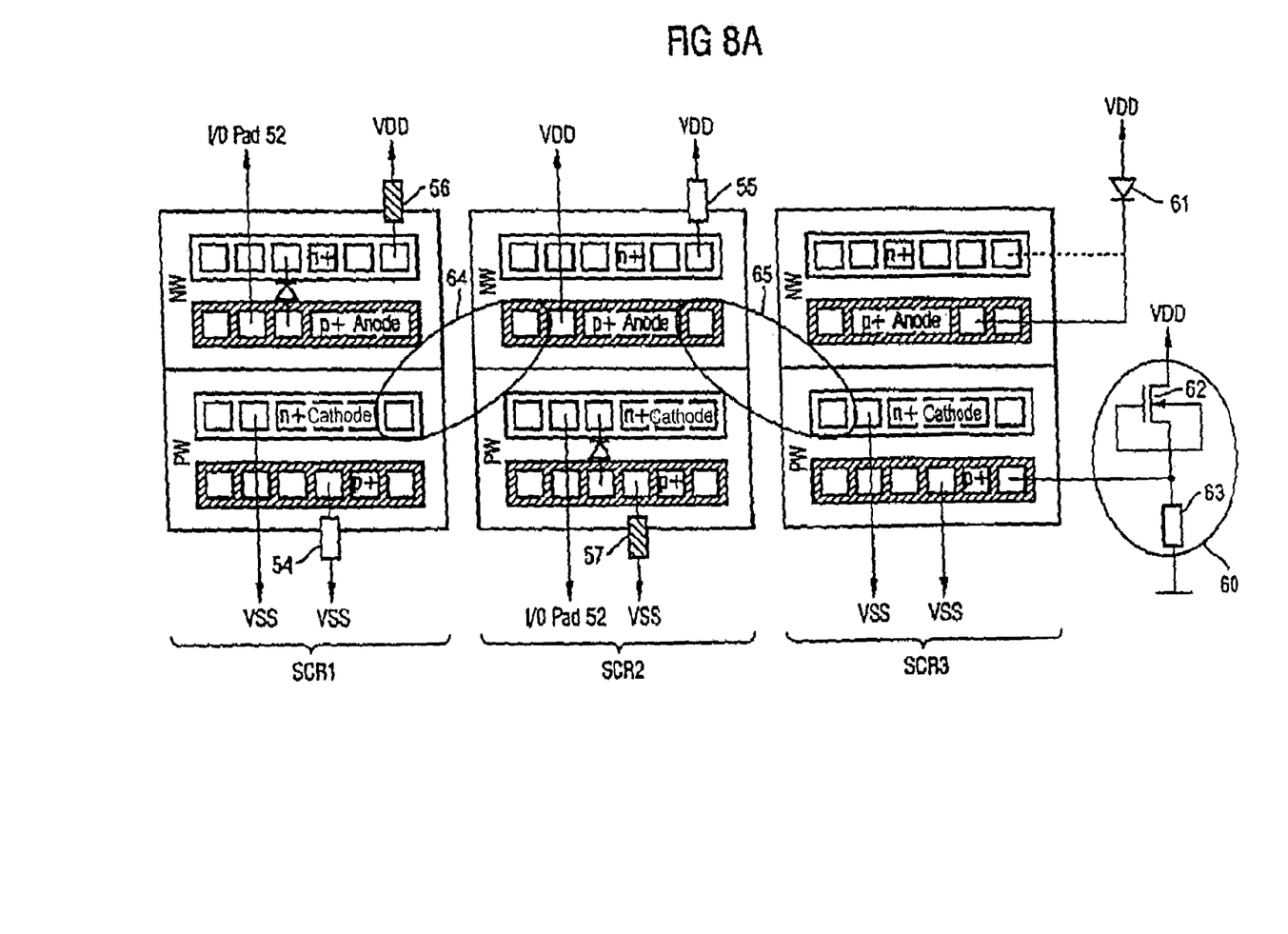
FIG. 8a shows an illustration of the layout of the ESD protective circuit shown in FIG. 7a, with a further thyristor added as a power clamp.

FIG. 8a shows the layout of the ESD protective circuit shown in FIG. 7a with a further transistor SCR3, which is not illustrated in FIG. 7a, added to it as a power clamp. The structures which are provided with the same reference symbols in FIGS. 7a and 8a correspond to one another. The illustrated arrows symbolize an electrical connection to form the correspondingly annotated connecting points. In order to allow a direct connection between the VDD network and the VSS network in the event of an ESD load, the thyristor SCR3 is additionally provided between the VDD network and the VSS network—as illustrated in FIG. 8a—and is driven via the trigger circuit 60. This comprises a voltage divider formed by a grounded gate NMOS transistor 62 and a series-connected resistance 63. Furthermore, one or more diodes 61 are provided between the anode of the thyristor SCR3 and the VDD network. These are used to avoid spurious triggering of the thyristor SCR3, which is also referred to as a latch-up. In consequence, the voltage which is dropped across the thyristor after the triggering process, that is to say in the self-latched state, between the VDD network and the VSS network, and which is also referred to as the holding voltage, is increased by one diode forward voltage per diode 61. The desired triggering of the thyristor SCR3 is initiated as a result of the breakdown of the NMOS transistor 62 and the voltage drop associated with this across the resistance 63. In the layout illustrated in FIG. 8a, cross-triggering of a parasitic thyristor can occur if the lateral distance between the two thyristors SCR1 and SCR2 as well as the two thyristors SCR2 and SCR3 is short. This is indicated by the markings 64 and 65.

Figure 8B:
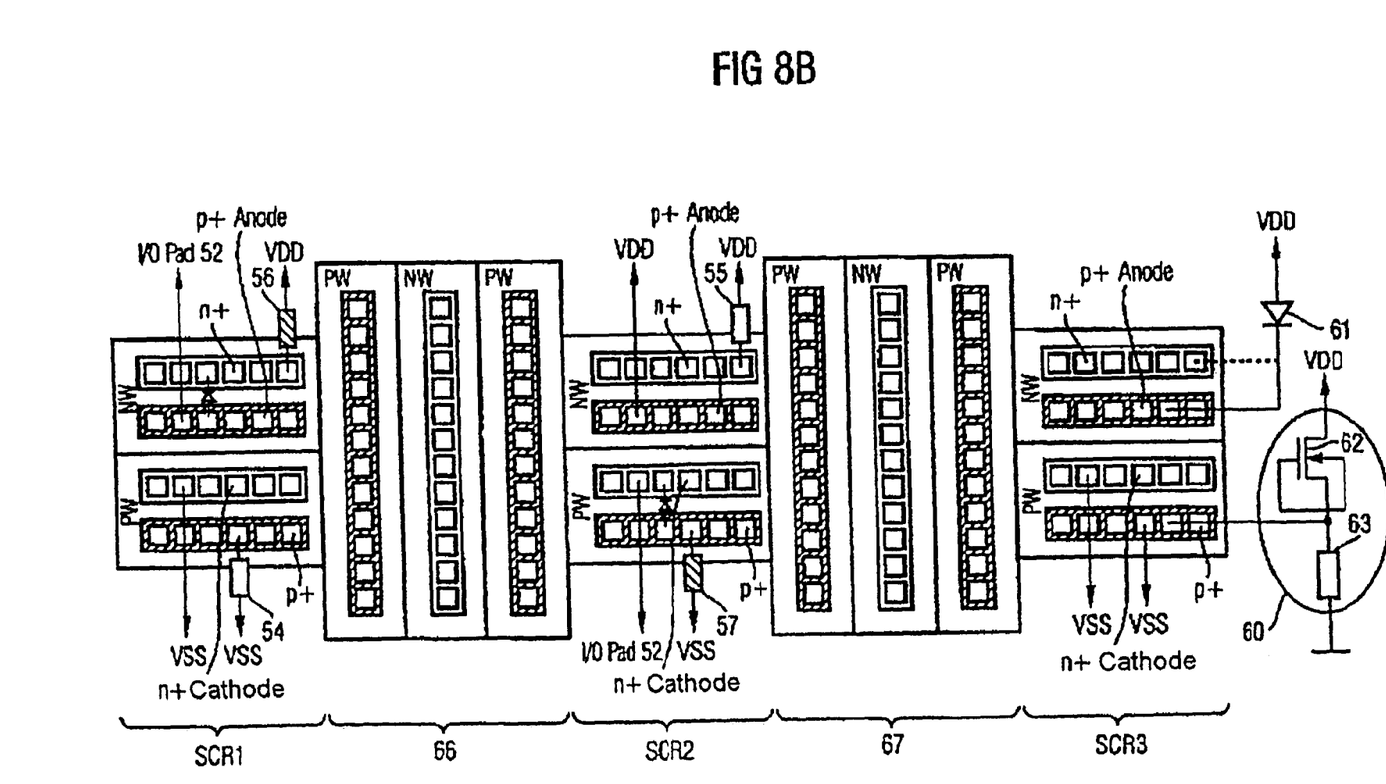
FIG. 8b shows an illustration of the layout of the ESD protective circuit shown in FIG. 7a, with a further thyristor added as a power clamp and with an additional guard ring structure.

FIG. 8b shows a layout of the ESD protective circuit as shown in FIG. 7a that is an alternative to that shown in FIG. 8a, with a further thyristor added to it as a power clamp, which is not illustrated in FIG. 7a. The structures which are provided with the same reference symbols in FIG. 8a and FIG. 8b correspond to one another. In contrast to the layout shown in FIG. 8a, the thyristors SCR1, SCR2 and SCR3 are separated from one another by means of two guard ring structures 66 and 67. The guard ring structure used in this case is formed from three adjacent areas or wells, with the first area being p doped, the second n-doped and the third p-doped. This measure precludes cross-triggering of a parasitic thyristor.

Figure 8C:
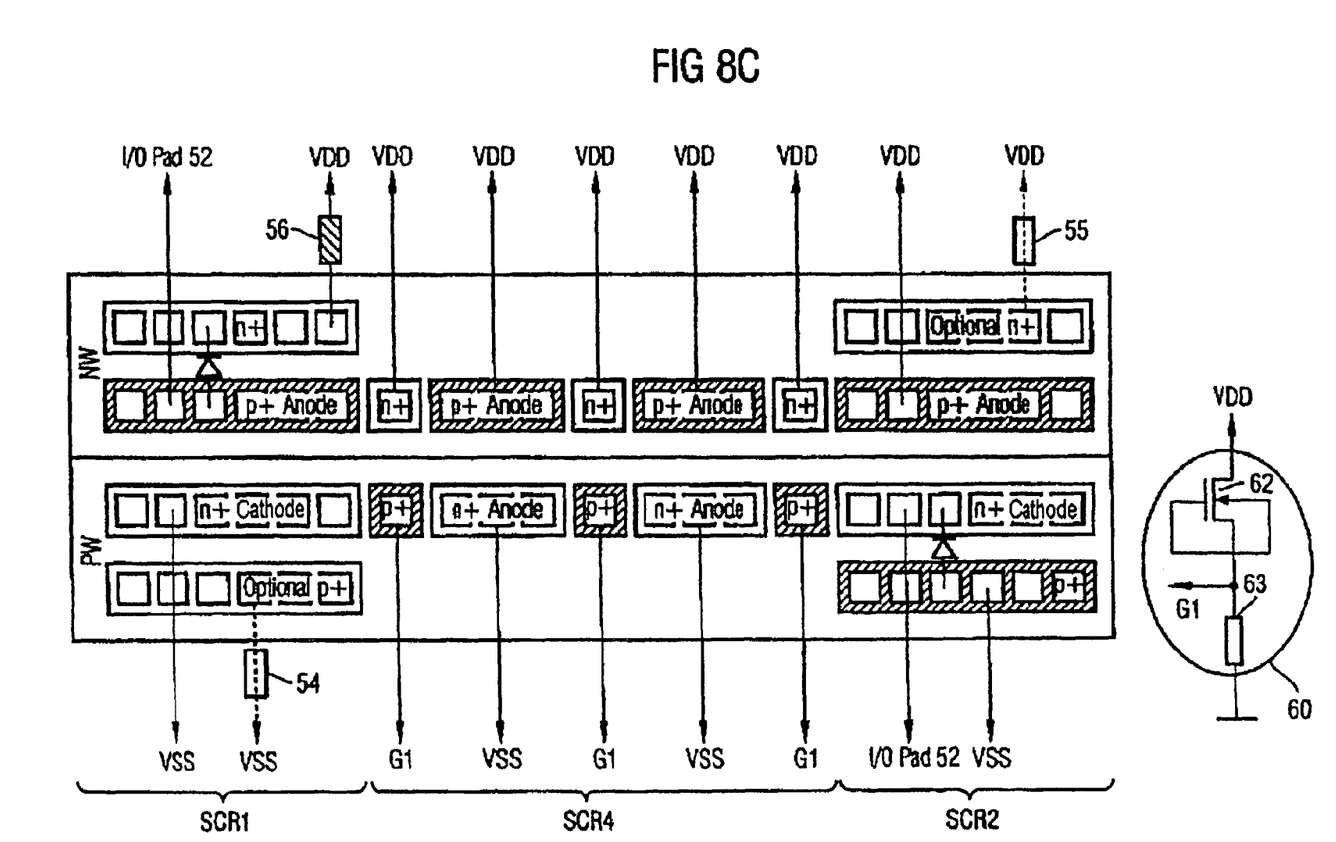
FIG. 8c shows an illustration of the layout of the ESD protective circuit as shown in FIG. 7a, with a so-called high holding current SCR added as a power clamp.

FIG. 8c shows a further layout as an alternative to those shown in FIG. 8a and FIG. 8b. In contrast to the power clamp SCR3 shown in FIG. 8a and FIG. 8b, a so-called high holding current SCR (HHI-SCR) SCR4 is used as the power clamp in FIG. 8c. The HHI-SCR is a special thyristor which has a very high trigger current and a high-holding current, which is achieved by a solid well contact. This increases the protection against inadvertent triggering of the thyristor during operation of the monolithically integrated circuit. The HHI-SCR is described in detail in the publication "High Holding Current SCRs (HHI-SCR) for ESD Protection and Latch-up Immune IC Operation," by M. Mergens et al., EOS/ESD-Symposium 2002, Lecture 1A3 herein incorporated by reference. In this case, the HHI-SCR SCR4 can be connected between the two thyristors SCR1 and SCR2. This results in the two thyristors SCR1 and SCR2 being isolated in a similar manner to that provided by a guard ring. An additional guard ring structure 66, as is shown in FIG. 8b, can then be avoided thus resulting in a significant surface area advantage.

Figure 9A:
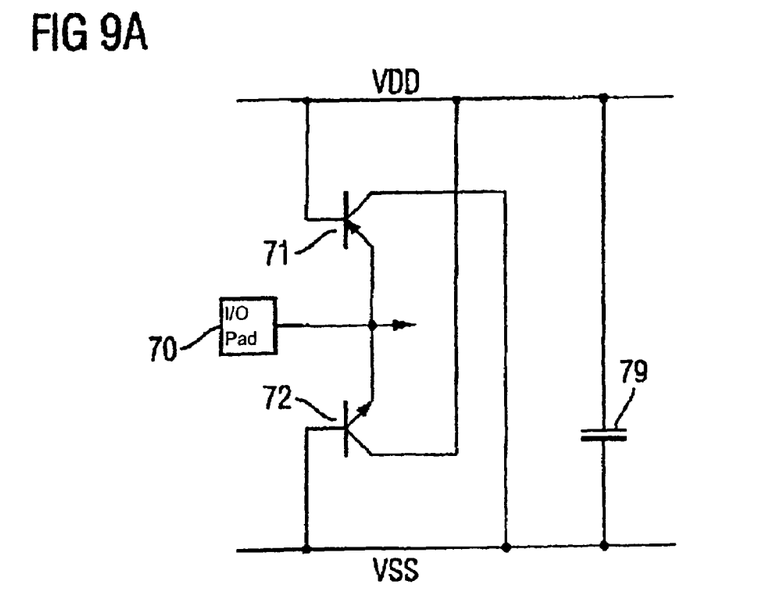
FIG. 9a shows an illustration of an ESD protective circuit with direct ESD charge dissipation via the collector current.

In principle, it would also be feasible to modify the collector-current-controlled activation of an ESD protective element in such a way that charge dissipation in the event of ESD is achieved directly via the collector current of a bipolar transistor connected to the I/O pad. An embodiment of an ESD protective circuit which operates in this way is illustrated in FIG. 9a. A pnp transistor structure 71 and an npn transistor structure 72 are connected on the emitter side to an I/O pad 70. In this case, the bipolar transistor structures 71 and 72 correspond to the bipolar transistor structures 11 and 12, respectively, in FIG. 2. The collector of the pnp transistor structure 71 is electrically connected to the VSS network, while the collector of the npn transistor structure 72 is electrically connected to the VDD network. Furthermore, a coupling capacitance 79 is provided between the supply networks. When a PS or ND-ESD load occurs, the base-emitter diode in the pnp transistor structure 71 or npn transistor structure 72, respectively, becomes forward-biased, with a displacement current at the same time flowing through the base-emitter diode and the coupling capacitance 79. This displacement current triggers a collector current in the pnp transistor structure 71 and in the npn transistor structure 72. This results in an ESD protective path to the VSS network and to the VDD network, respectively, being formed via the emitter-collector path. If the initial collector current is sufficiently high, then the respective bipolar transistor structure is driven into a self-holding high-current mode, and remains switched on via the base-emitter diode even without any displacement current. The ESD discharge path is then maintained for the duration of the ESD event even after the displacement current has decayed. In this case, it is advantageous for the bipolar transistor structures 71 and 72 to be in the form of local protective elements against VDD and VSS, respectively, at the I/O pad. In many cases, this makes it possible to save a local power clamp with one of the trigger circuits that have been mentioned, thus resulting in a surface area advantage.

Figure 9B:
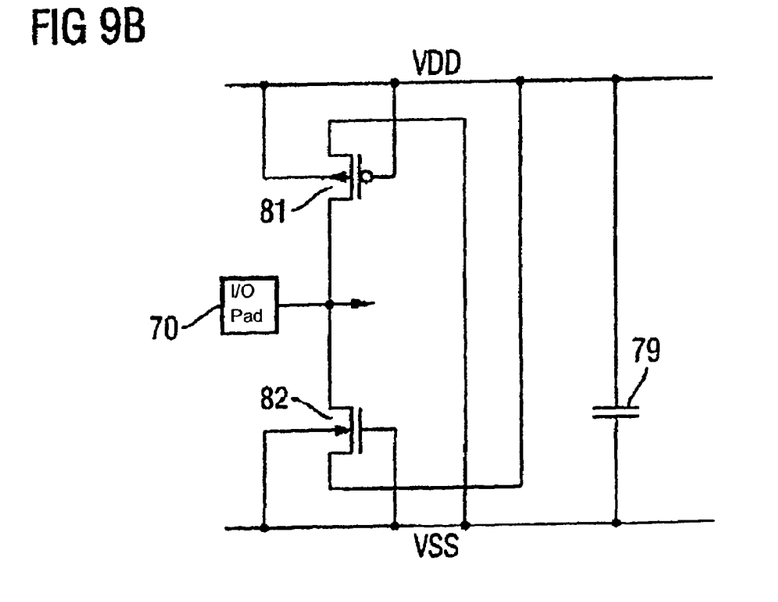
FIG. 9b shows an illustration of a CMOS-oriented ESD protective circuit with direct ESD charge dissipation via the collector current.

FIG. 9b illustrates a CMOS-oriented variant of the ESD protective circuit as shown in FIG. 9a. The structures which are provided with the same reference symbols in FIG. 9a and FIG. 9b correspond to one another. The pnp and npn transistor elements 71 and 72 shown in FIG. 9a are provided, in the circuit illustrated in FIG. 9b, by the parasitic bipolar transistors in a PMOS transistor 81 and an NMOS transistor 82, respectively. In this case, the statements that have already been made with reference to FIG. 5 apply appropriately to the parasitic bipolar transistors.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. An ESD protective circuit for protection of an input or output of a monolithically integrated circuit having two supply networks, the ESD protective circuit comprising:
 a bipolar transistor structure with an emitter, a base and a collector, the emitter electrically connected to the input or output and the base electrically connected to one of the two supply networks; and
 an ESD protective element which is electrically connected to both supply networks,
 wherein the collector produces a current signal which is used for triggering of the ESD protective element in the event of an ESD load at the input or output.

2. The ESD protective circuit according to claim 1, wherein the bipolar transistor structure is a pnp transistor structure, and the base of the pnp transistor structure is electrically connected to a positive supply network of the two supply networks.

3. The ESD protective circuit according to claim 1, wherein the bipolar transistor structure is an npn transistor structure, and the base of the npn transistor structure is electrically connected to a negative supply network of the two supply networks.

4. The ESD protective circuit according to claim 2, wherein the bipolar transistor structure is an npn transistor structure, and the base of the npn transistor structure is electrically connected to a negative supply network of the two supply networks.

5. The ESD protective circuit according to claim 1, wherein the ESD protective element has a thyristor structure.

6. The ESD protective circuit according to claim 2, wherein the ESD protective element has a thyristor structure, the thyristor structure can be controlled from a cathode side via a cathode-side control connection, and the collector of the pnp transistor structure is electrically connected to the cathode-side control connection.

7. The ESD protective circuit according to claim 3, wherein the ESD protective element has a thyristor structure, the thyristor structure can be controlled on an anode side via an anode-side control connection, and the collector of the npn transistor structure is electrically connected to the anode-side control connection.

8. The ESD protective circuit according to claim 4, wherein the ESD protective element has a thyristor structure, the thyristor structure can be controlled from a cathode side via a cathode-side control connection and on an anode side via an anode-side control connection, the collector of the pnp transistor structure is electrically connected to the cathode-side control connection, and the collector of the npn transistor structure is electrically connected to the anode-side control connection.

9. The ESD protective circuit according to claim 2, wherein the ESD protective element has a thyristor structure and the pnp transistor structure is a component of the thyristor structure.

10. The ESD protective circuit according to claim 3, wherein the ESD protective element has a thyristor structure and the npn transistor structure is a component of the thyristor structure.

11. The ESD protective circuit according to claim 4, wherein the ESD protective element has first and second thyristor structures, the pnp transistor structure is a component of the first thyristor structure, and the npn transistor structure is a component of the second thyristor structure.

12. The ESD protective circuit according to claim 11, wherein the first and second thyristor structures are separated from one another by a guard ring structure so as to prevent cross-triggering between the first and second thyristor structures.

13. The ESD protective circuit according to claim 11, wherein the first and second thyristor structures are separated from one another by a high holding circuit SCR structure, so as to prevent cross-triggering between the first and second thyristor structures and between one of the first and second thyristor structures and the high holding current SCR structure.

14. The ESD protective circuit according to claim 1, further comprising a coupling capacitor is connected between the two supply networks.

15. The ESD protective circuit according to claim 1, wherein during operation of the monolithically integrated circuit, the input or output is decoupled from all diffusion wells in the ESD protective circuit via pn junctions which are each reverse-biased.

16. The ESD protective circuit according to claim 15, wherein the ESD protective circuit is designed for protection of an input or output which is transmitting radio-frequency signals.

17. The ESD protective circuit according to claim 1, wherein:
 the ESD protective circuit is designed for ESD protection of a plurality of at least one of inputs or outputs,
 a bipolar transistor structure and an ESD protective element between the two supply networks is provided for each input or output, and
 when an ESD load occurs at one of the inputs or outputs, a collector of the respective bipolar transistor structure produces a current signal which is used to trigger the ESD protective element associated with the input or output in which the ESD load has occurred.

* * * * *